United States Patent
Min et al.

(10) Patent No.: US 12,230,720 B2
(45) Date of Patent: Feb. 18, 2025

(54) SEMICONDUCTOR STRUCTURE WITH RECESSED TOP SEMICONDUCTOR LAYER IN SUBSTRATE AND METHOD OF FABRICATING THE SAME

(71) Applicant: Taiwan Semiconductor Manufacturing Company, Ltd., Hsin-Chu (TW)

(72) Inventors: Wei-Lun Min, Nantou County (TW); Ko-Cheng Liu, Hsinchu (TW); Chang-Miao Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 843 days.

(21) Appl. No.: 17/461,500

(22) Filed: Aug. 30, 2021

(65) Prior Publication Data
US 2023/0068354 A1    Mar. 2, 2023

(51) Int. Cl.
*H01L 29/786* (2006.01)
*H01L 21/762* (2006.01)
*H01L 29/66* (2006.01)

(52) U.S. Cl.
CPC .. *H01L 29/78696* (2013.01); *H01L 21/76224* (2013.01); *H01L 29/66545* (2013.01); *H01L 29/66742* (2013.01); *H01L 29/78603* (2013.01)

(58) Field of Classification Search
CPC ......... H01L 29/66545; H01L 29/66742; H01L 29/78603; H01L 21/76224
See application file for complete search history.

(56) References Cited

U.S. PATENT DOCUMENTS

2020/0266060 A1* 8/2020 Cheng ................ H01L 29/0673

* cited by examiner

*Primary Examiner* — Tucker J Wright
(74) *Attorney, Agent, or Firm* — HAYNES AND BOONE, LLP

(57) ABSTRACT

A method includes providing a substrate including a first semiconductor layer over a dielectric layer, thinning the first semiconductor layer, forming a stack of alternating second semiconductor layers and third semiconductor layers over the thinned first semiconductor layer, forming a fin active region protruding from the substrate including a portion of the thinned first semiconductor layer and the stack of alternating second semiconductor layers and third semiconductor layers, forming isolation features over an exposed portion of the dielectric layer, forming a dummy gate stack over the fin active region, forming a source/drain (S/D) recess in the fin active region adjacent to the dummy gate stack, forming an epitaxial S/D feature in the S/D recess, removing the second semiconductor layers to form openings between the third semiconductor layers, and forming a metal gate stack in the openings and in place of the dummy gate stack.

20 Claims, 15 Drawing Sheets

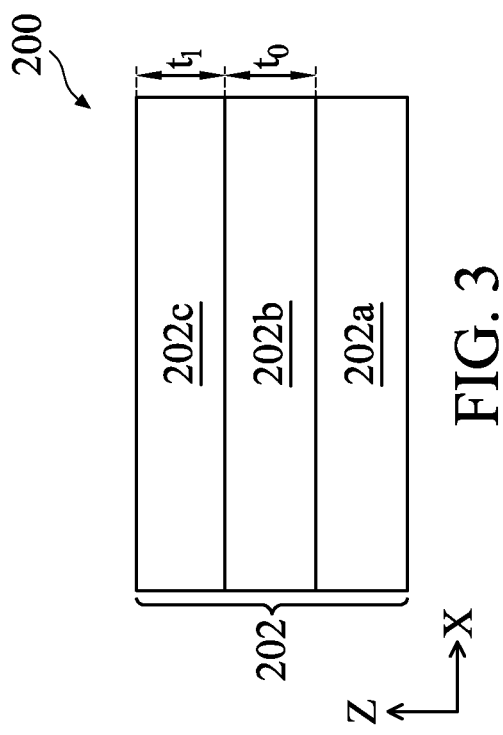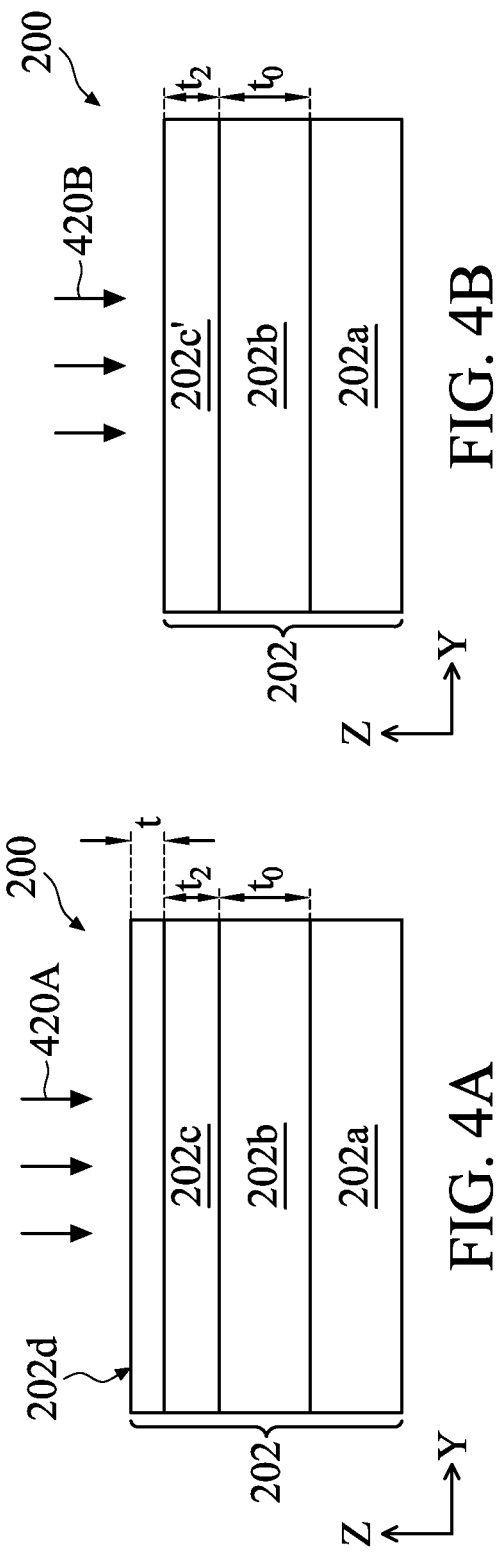

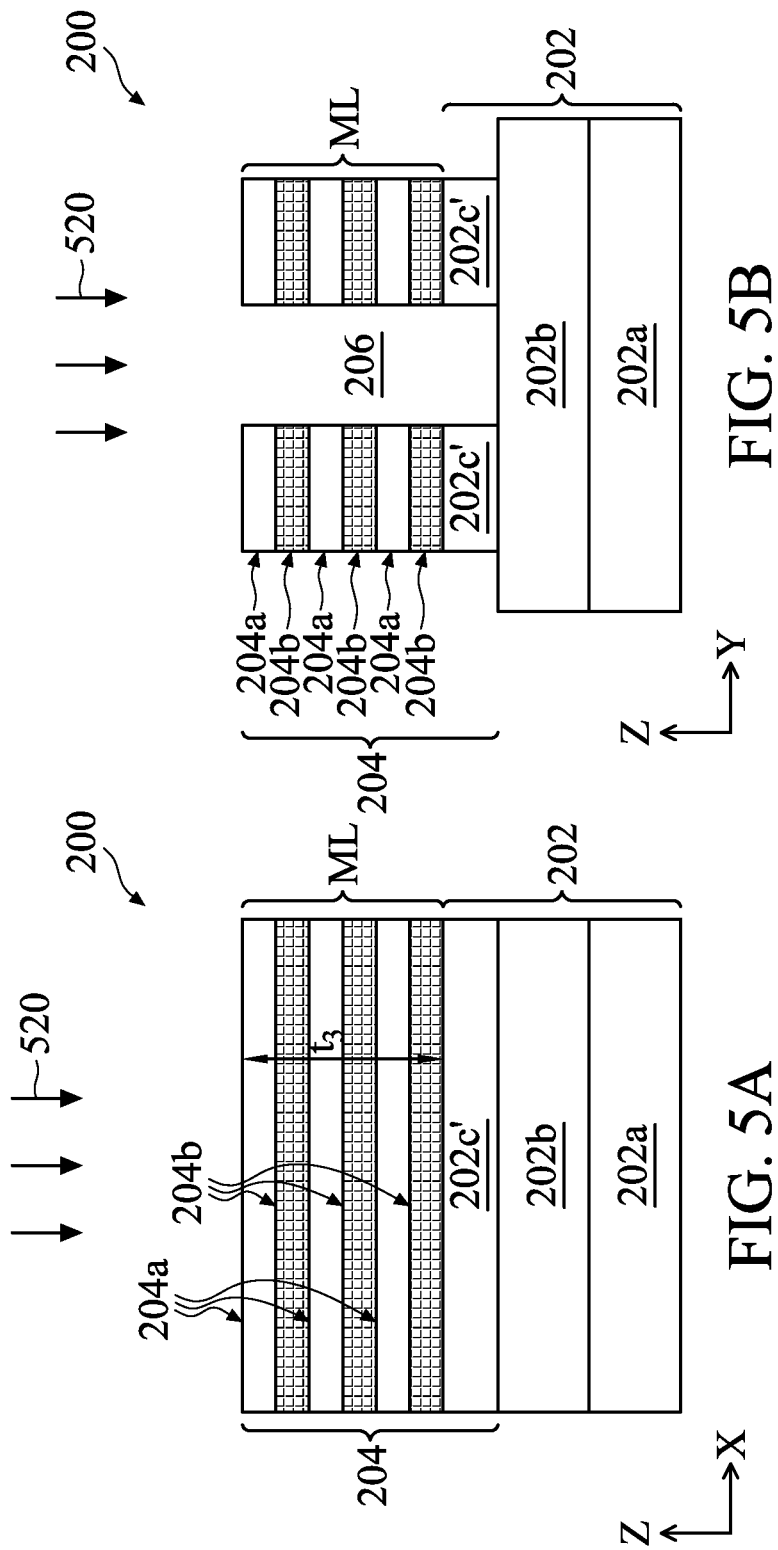

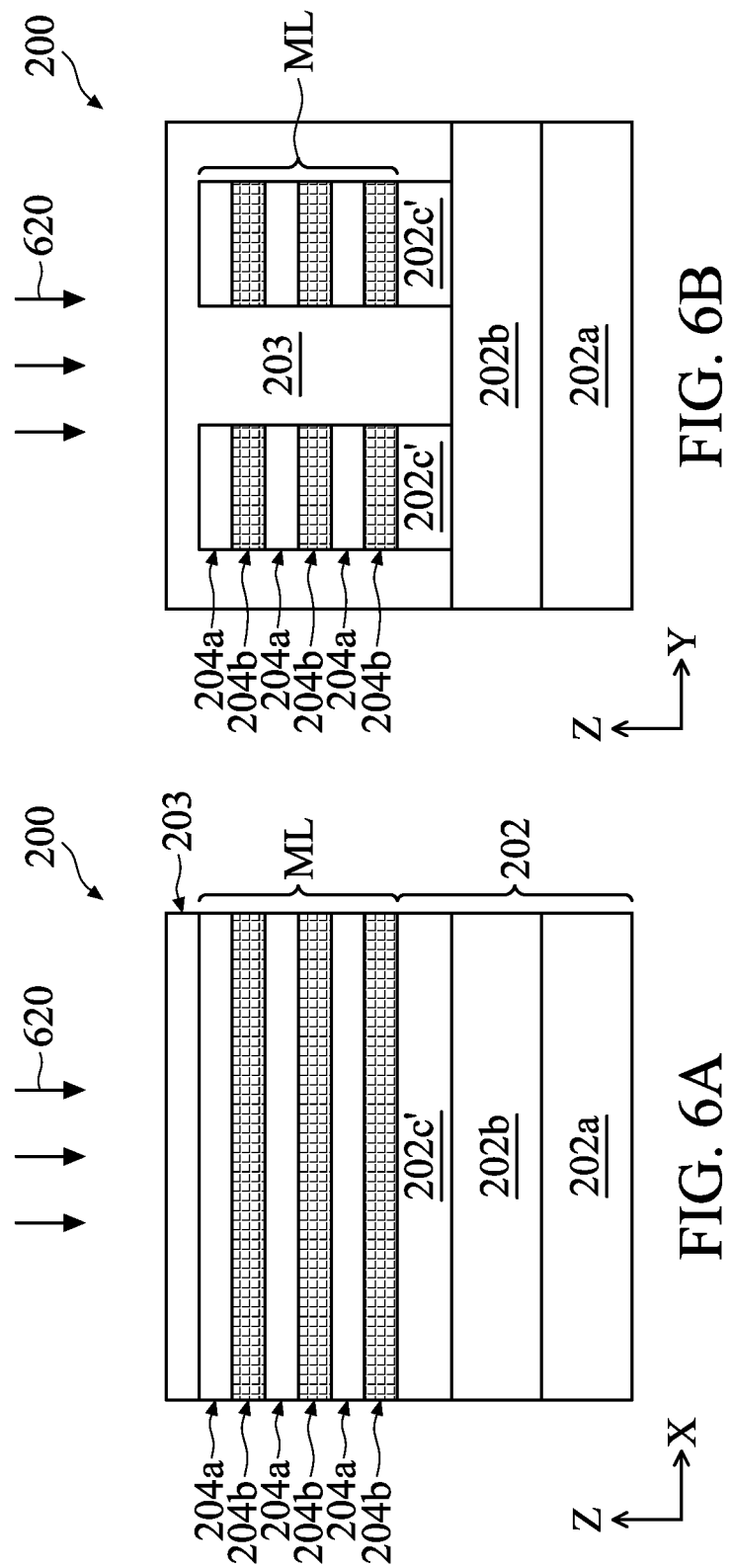

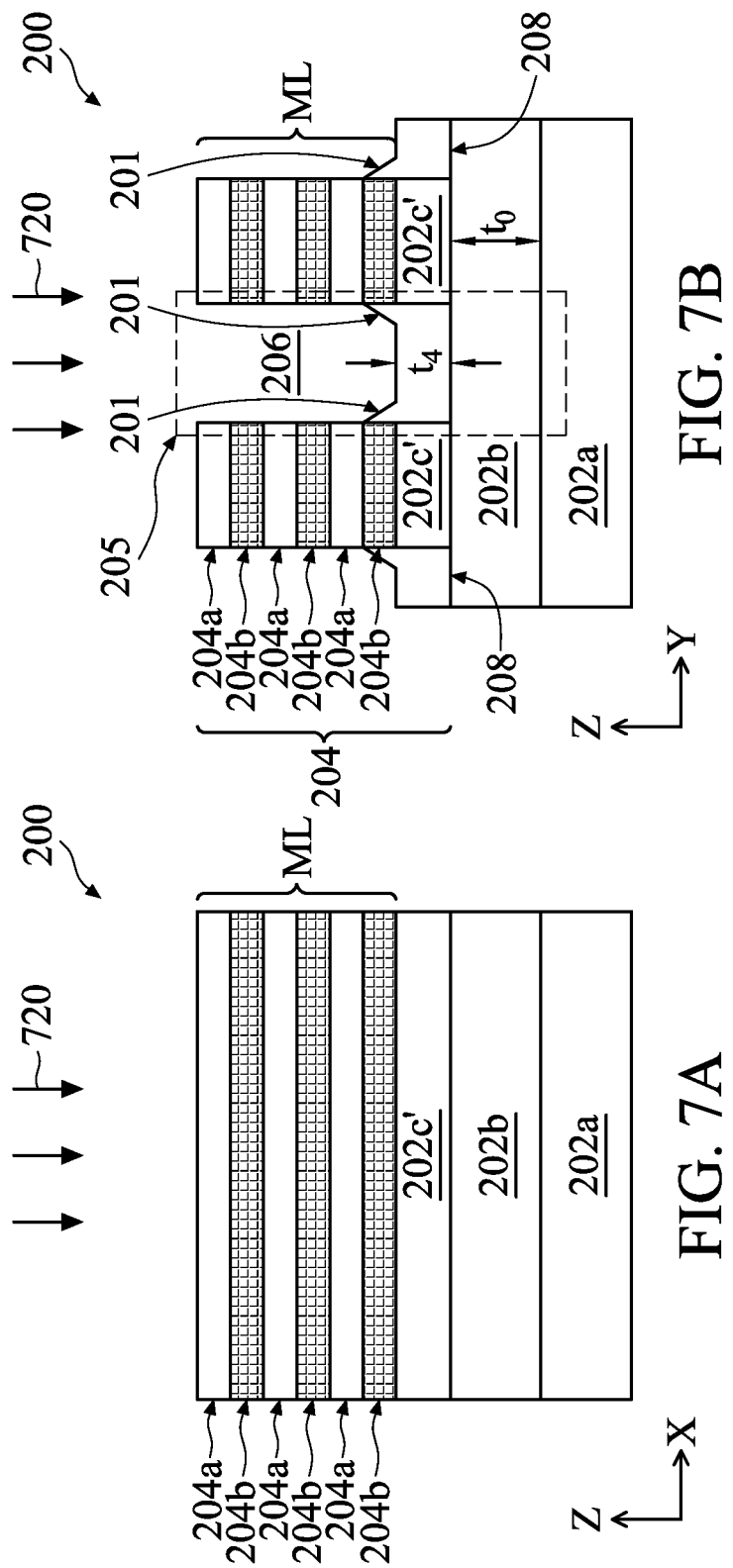

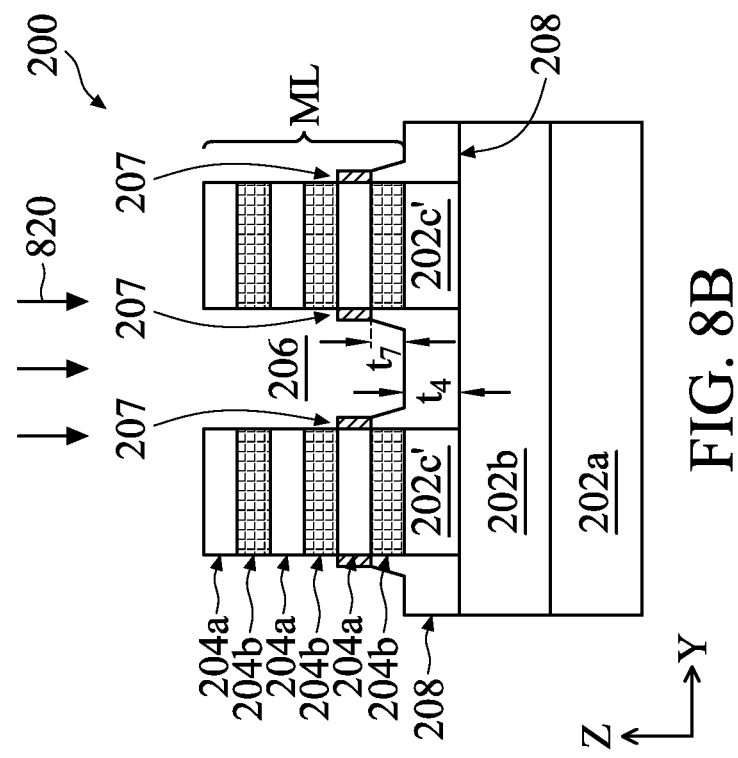
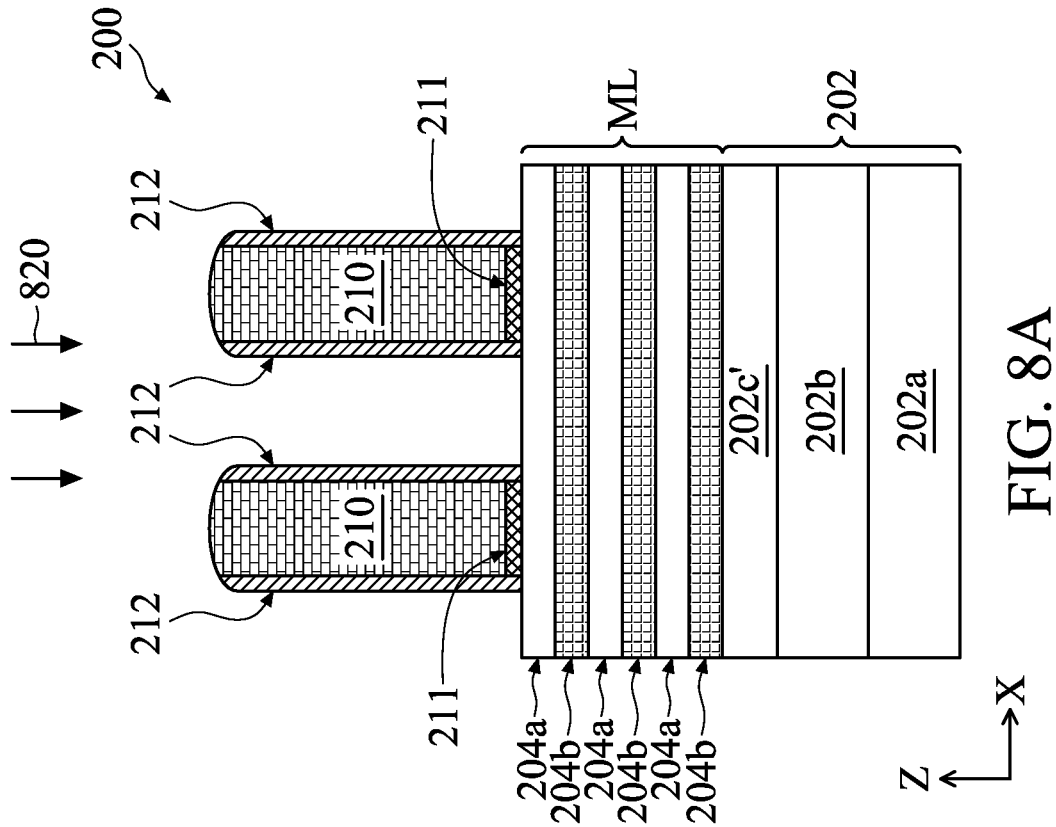
FIG. 8A
FIG. 8B

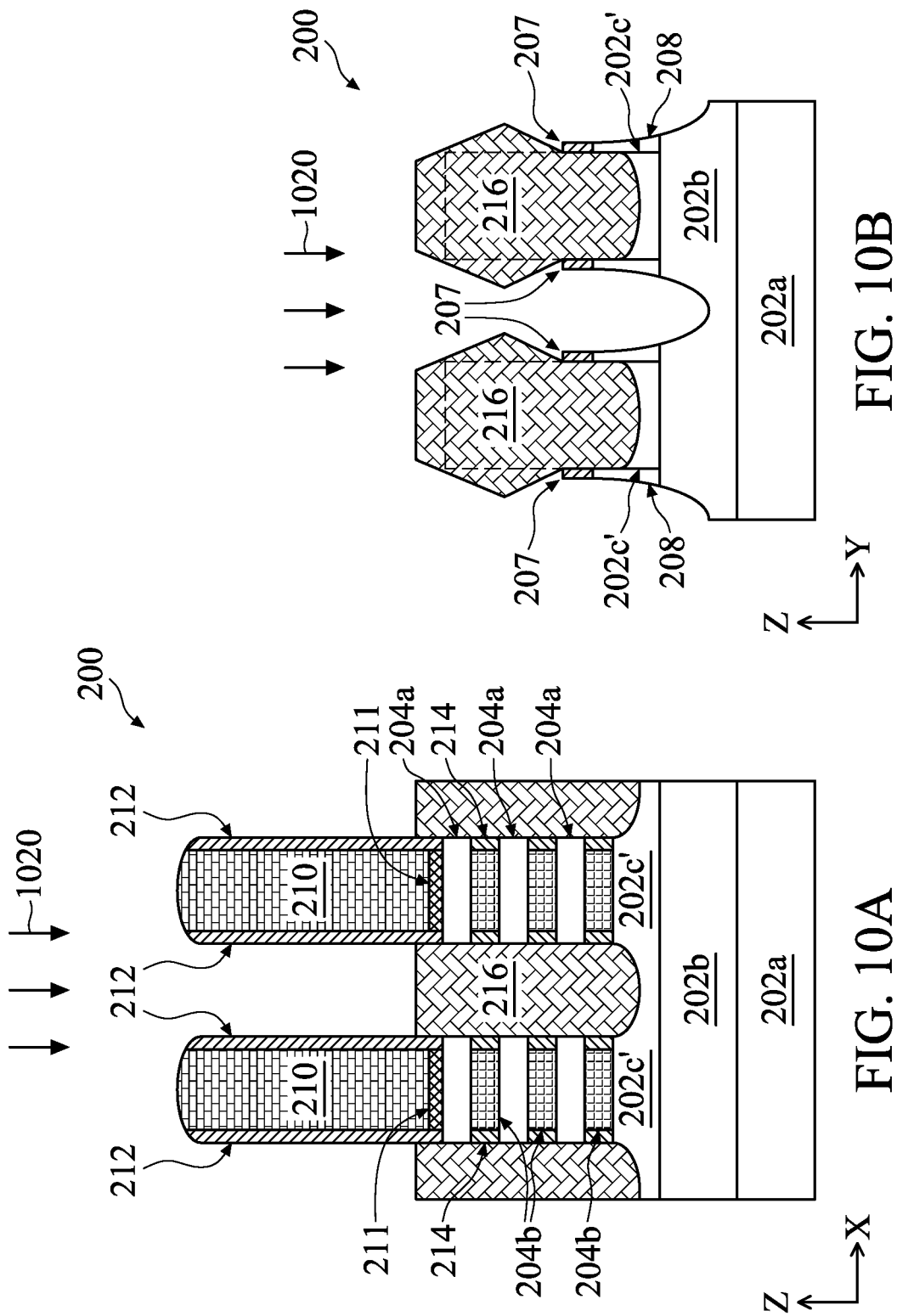

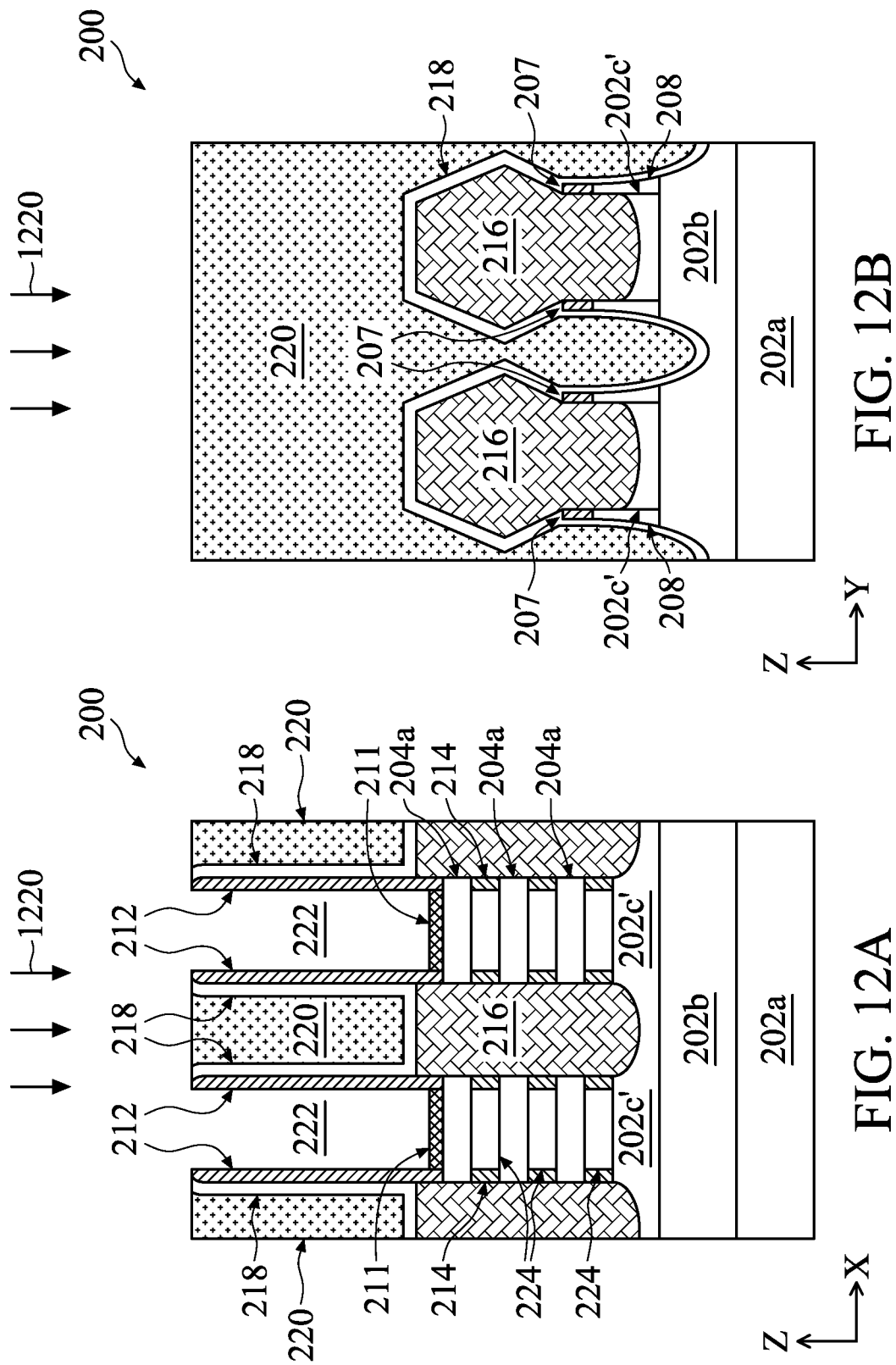

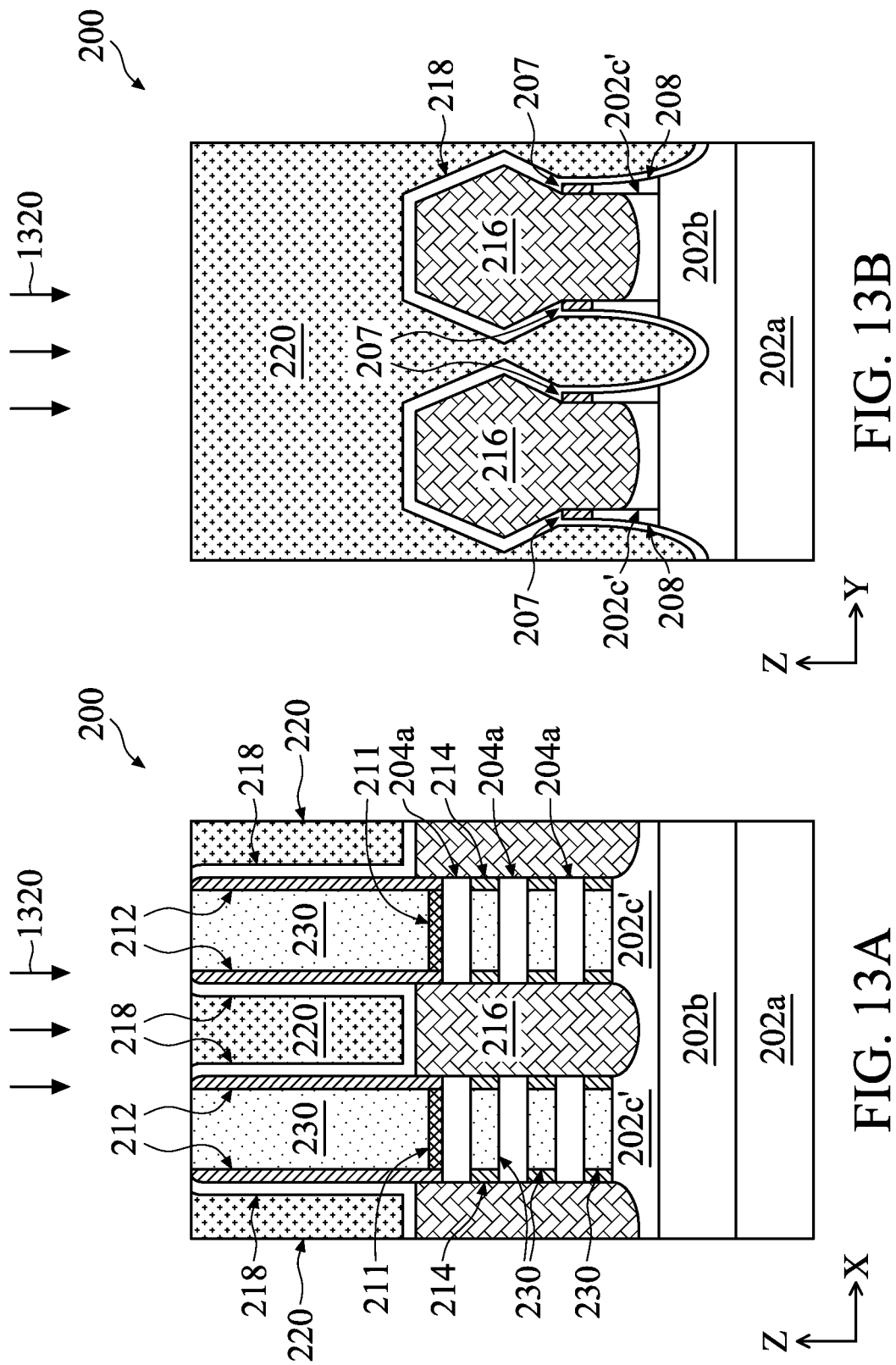

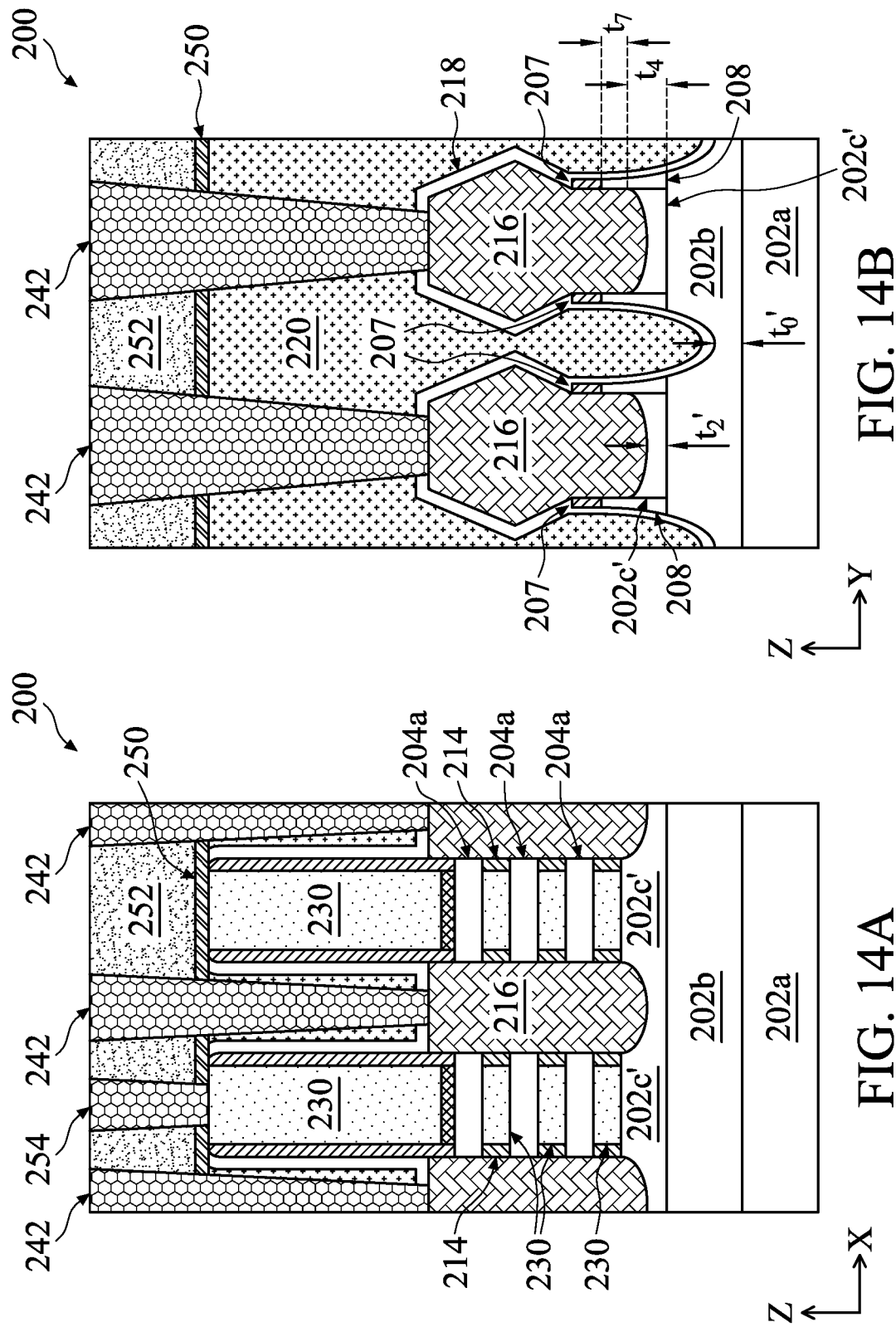

SEMICONDUCTOR STRUCTURE WITH RECESSED TOP SEMICONDUCTOR LAYER IN SUBSTRATE AND METHOD OF FABRICATING THE SAME

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

Multi-gate transistors, such as gate-all-around (GAA) field-effect transistors (FETs), have been incorporated into various memory and core devices to reduce IC chip footprint while maintaining reasonable processing margins. However, in some instances, GAA FETs may suffer current leakage at the bottommost portion of the stack of channel layers between doped epitaxial source/drain (S/D) features. While methods of addressing such issues have been generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4A, 4B, 5A, 6A, 7A, 8A, 9A, 10A, 11A, 12A, 13A, and 14A are cross-sectional views of the semiconductor device taken along line AA' as shown in FIGS. 2A and/or 2B during intermediate stages of the method shown in FIG. 1 according to various embodiments of the present disclosure.

FIGS. 5B, 6B, 7B, 7C, 8B, 9B, 10B, 11B, 12B, 13B, and 14B are cross-sectional views of the semiconductor device taken along line BB' as shown in FIGS. 2A and/or 2B during intermediate stages of the method shown in FIG. 1 according to various embodiments of the present disclosure.

DETAILED DESCRIPTION

Figure 1:
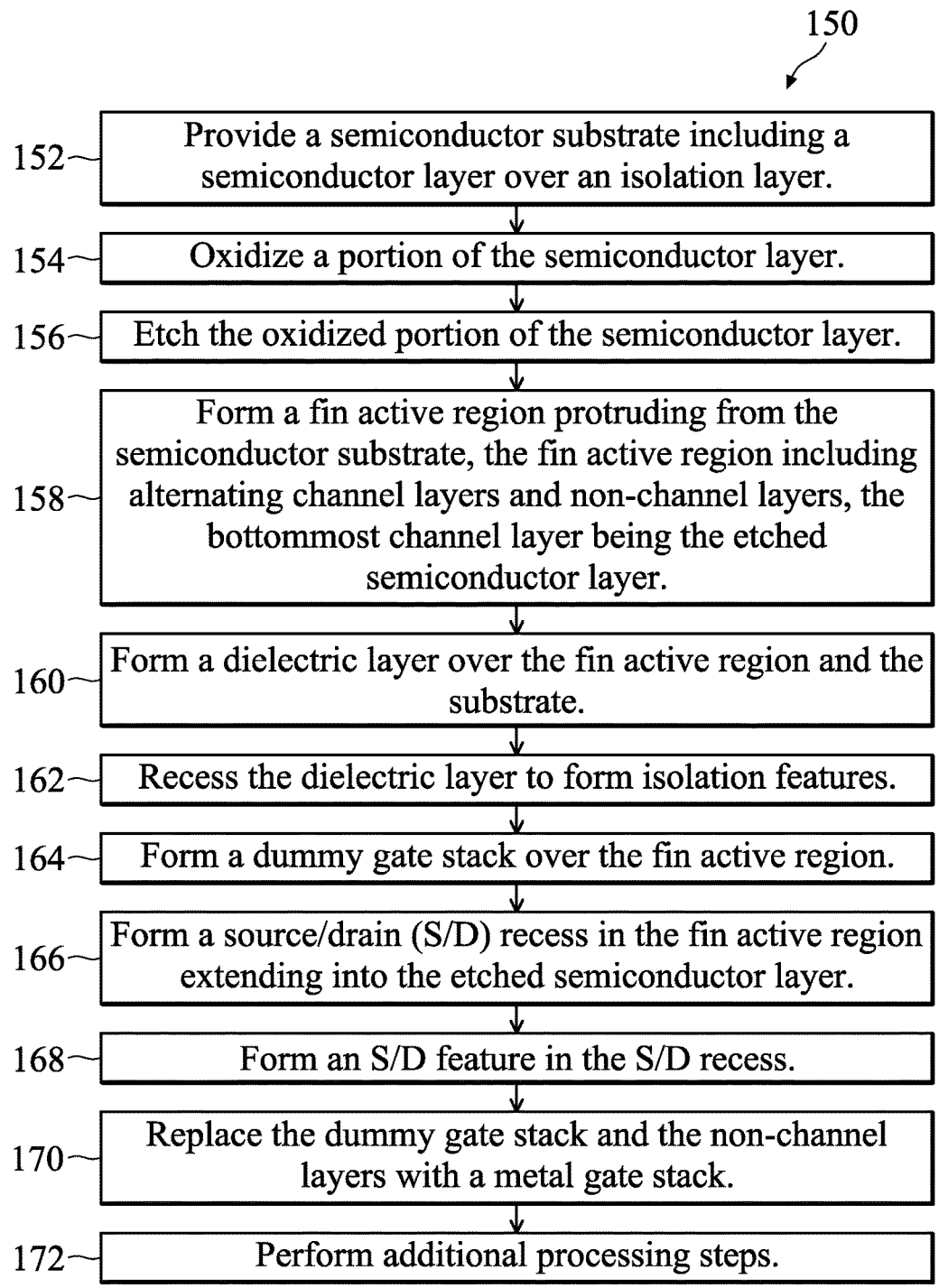
FIG. 1 illustrates a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nanometers" encompasses the dimension range from 4.5 nanometers to 5.5 nanometers. Still further, the present disclosure may repeat reference numerals and/or letters in the various examples. This repetition is for the purpose of simplicity and clarity and does not in itself dictate a relationship between the various embodiments and/or configurations discussed.

GAA FETs have demonstrated attractive qualities over single-gate devices in terms of control over short-channel effects (SCEs) and driving ability. A GAA FET may generally include a stack of channel layers in a multi-layer structure (ML) disposed over a substrate, epitaxial S/D features formed over or in an active region (e.g., a fin), and a metal gate structure interleaved with the stack of channel layers and interposed between the S/D features. However, in some instances, GAA FETs may suffer current leakage at the bottommost portion of the stack of channel layers between the S/D features. To address this issue, some existing implementations introduce a doped well in the semiconductor substrate to reduce the extent of current leakage. While this and other approaches have been generally adequate, they are not entirely satisfactory in all aspects. For example, dopants from the doped well may inadvertently diffuse into the stack of the channel layers (especially the bottommost channel layer) and cause degradation in carrier mobility. In other existing implementations, a buried isolation layer between two semiconductor layers (e.g., an oxide layer buried between two silicon layers in a silicon-on-isolator substrate) may be introduced as the substrate to curtail any potential current punch-through between the S/D features. In this regard, however, because the top semiconductor layer of the substrate also serves as the bottommost channel layer, reducing current leakage may be improved at the expense of other issues related to the fabrication of the GAA FETs. Thus, for at least these reasons, improvements in methods of forming GAA FETs with improved processing feasibility and reduced current leakage are desired.

Figure 2A:
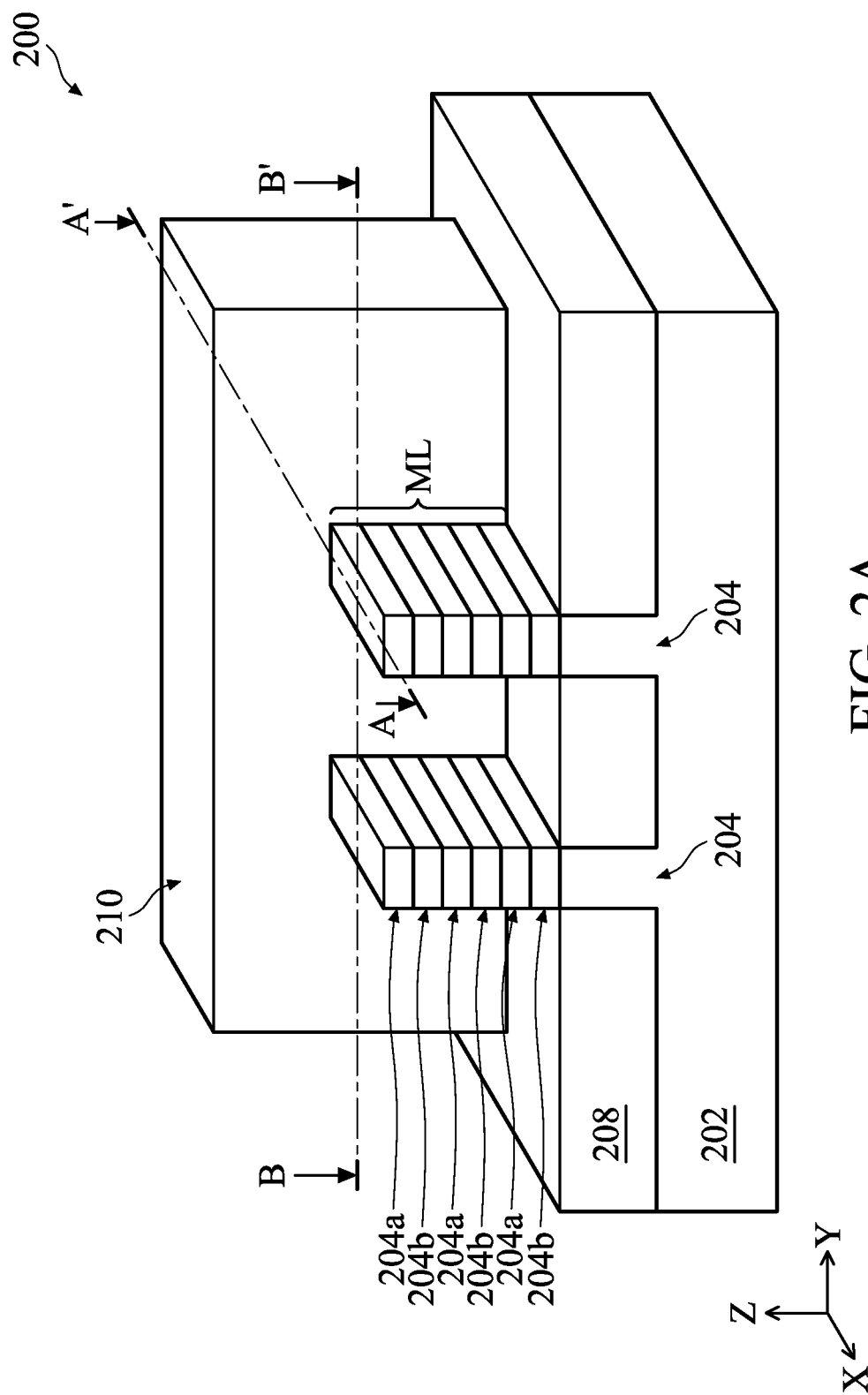
FIG. 2A is a three-dimensional perspective view of an example semiconductor device according to various embodiments of the present disclosure.
Figure 2B:
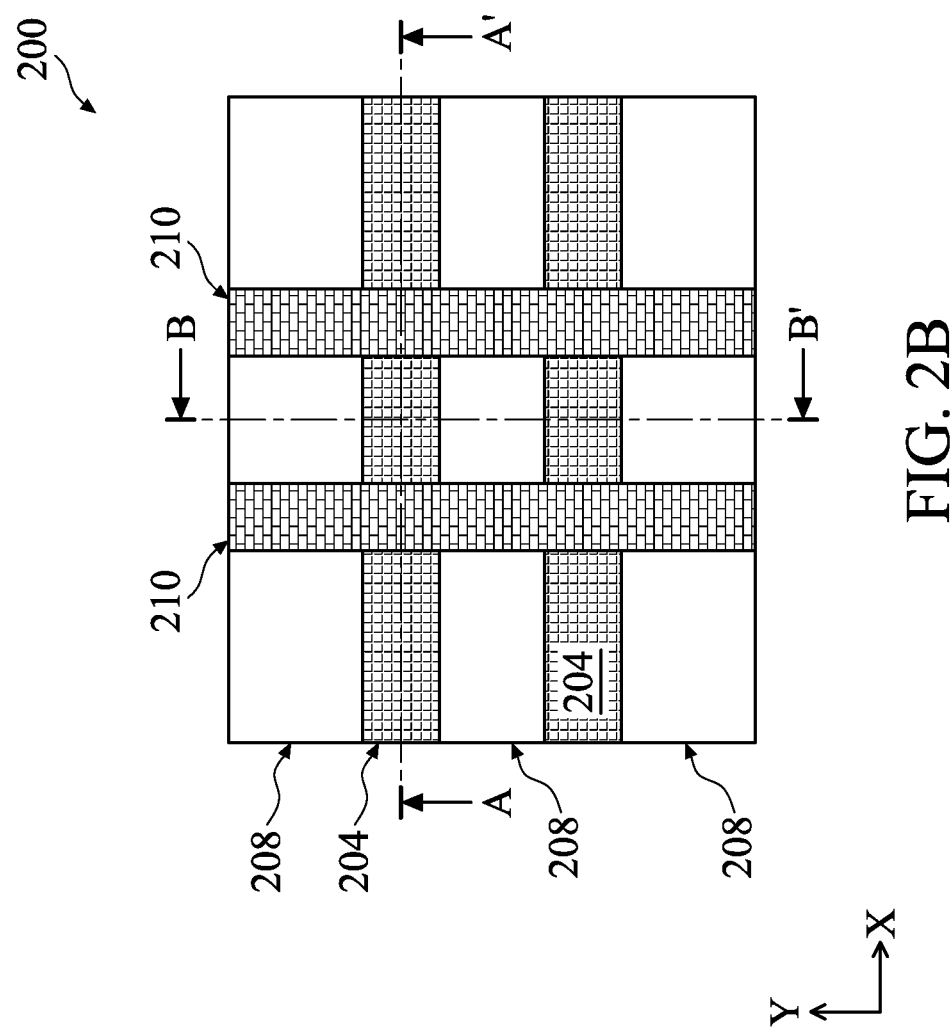
FIG. 2B is a planar top view of the semiconductor device shown in FIG. 2A according to various embodiments of the present disclosure.

Referring to FIG. 1, a flowchart of a method 150 of forming a semiconductor structure 200 (hereafter simply referred to as the "structure 200") is illustrated according to various aspects of the present disclosure. Method 150 is merely an example and is not intended to limit the present disclosure beyond what is explicitly recited in the claims. Additional operations can be provided before, during, and after method 150, and some operations described can be replaced, eliminated, or moved around for additional embodiments of the method. Method 150 is described below in conjunction with FIGS. 3-14B, which are cross-sectional views of the structure 200 taken along the dashed lines AA' and BB' shown in FIGS. 2A and 2B at intermediate steps of method 150. The structure 200 may be an intermediate device fabricated during processing of an IC, or a portion thereof, that may comprise static random-access memory (SRAM) and/or other logic circuits, passive components such as resistors, capacitors, and inductors, and active components such as GAA FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. The present disclosure is not limited to any particular number of devices or device regions, or to any particular device configurations. For example, though the structure 200 as illustrated is a three-dimensional device, the present disclosure may also provide embodiments for fabricating planar devices. Additional features can be added to the structure 200, and some of the features described below can be replaced, modified, or eliminated in other embodiments of the structure 200.

Referring to FIGS. 1, 2A, 2B, and 3, method 150 at operation 152 provides (or is provided with) a semiconductor substrate 202 (hereafter referred to as the "substrate 202"). In the present embodiments, referring to FIG. 3, the substrate 202 includes a top semiconductor layer 202c defined by a thickness $t_1$, an isolation layer 202b defined by a thickness $t_0$, and a bottom semiconductor layer 202a having a thickness that is much greater than $t_0$ and $t_1$, where the isolation layer 202b is sandwiched or buried between the bottom semiconductor layer 202a and the top semiconductor layer 202c.

The top semiconductor layer 202c and the bottom semiconductor layer 202a may each include an elemental (single element) semiconductor, such as silicon (Si), germanium (Ge), and/or other suitable materials; a compound semiconductor, such as silicon carbide (SiC), gallium arsenide (GaAs), gallium phosphide (GaP), indium phosphide (InP), indium arsenide (InAs), indium antimonide (InSb), and/or other suitable materials; and/or an alloy semiconductor, such as SiGe, GaAsP, AnnAs, AlGaAs, GaInAs, GaInP, GaInAsP, and/or other suitable materials. In the present embodiments, the top semiconductor layer 202c and the bottom semiconductor layer 202a are each free of a dielectric material. In the present embodiments, the isolation layer 202b includes a dielectric material, such as silicon oxide (SiO and/or $SiO_2$), silicon nitride (SiN), oxygen-containing silicon nitride (SiON), and/or other suitable materials. In the present embodiments, the top semiconductor layer 202c has substantially the same composition as the bottom semiconductor layer 202a and both include silicon, where the isolation layer 202b includes $SiO_x$.

In some examples where the structure 200 includes FETs, various doped regions may be disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or in a raised structure. Doped regions may be formed by implantation of dopant atoms, in-situ doped epitaxial growth, and/or other suitable techniques. Of course, these examples are for illustrative purposes only and are not intended to be limiting.

Referring to FIGS. 1 and 4A, method 150 at operation 154 oxidizes a top portion of the top semiconductor layer 202c in a process 420A to form an oxidized top portion 202d. The top portion of the top semiconductor layer 202c may be oxidized utilizing any suitable method. In some embodiments, the oxidizing process includes thermal oxidation, chemical oxidation, and/or other suitable methods. In some embodiments, the oxidized top portion 202d has a thickness t that is about 35% to about 55% (e.g., about 45%) of the thickness $t_1$. In some examples, the thickness t may be about 7 nanometers to about 11 nanometers (e.g., about 9 nanometers), while $t_1$ may be about 20 nanometers.

Referring to FIGS. 1 and 4B, method 150 at operation 156 removes the oxidized top portion 202d in an etching process 420B to form a recessed top semiconductor layer 202c'. The oxidized top portion 202d may be etched utilizing any suitable method. In some embodiments, the etching process includes dry etching, wet etching, reactive ion etching (RIE), and/or other suitable processes. Prior to the process 420A and the etching process 420B, $t_1$ is greater than or equal to $t_0$. In some examples, $t_1$ may be about 15 nanometers to 40 nanometers (e.g., 20 nanometers) and to may be about 10 nanometers to 30 nanometers (e.g., 20 nanometers). After performing the process 420A and the etching process 420B, the recessed top semiconductor layer 202c' has a thickness $t_2$ that is less than the thickness $t_0$. In some embodiments, the thickness $t_2$ is about 45% to about 65% (e.g., about 55%) of the thickness $t_0$. In some embodiments, the thickness $t_2$ is about 35% to about 75% of the thickness $t_1$. In some examples, $t_2$ may be about 9 nanometers to about 13 nanometers. In one such example, $t_2$ may be about 11 nanometers while to may be about 20 nanometers.

As will be discussed in detail below, the recessed top semiconductor semiconductor layer 202c' serves as one of the channel layers (e.g., the bottommost channel layer) of a multi-layer stack subsequently formed over the substrate 202. If the percentage of the thickness $t_2$ with respect to the thickness $t_0$ is greater than about 65%, a metal gate structure formed in subsequent processes may not have sufficient gate control over the recessed top semiconductor layer 202c', especially at its bottom portion that is closest to the substrate 202. The insufficient gate control increases current leakage between two adjacent S/D features and results in poor device performance. On the other hand, if the percentage of the thickness $t_2$ with respect to the thickness $t_0$ is less than about 45%, the process control may become challenging during subsequent fabricating processes. For example, the isolation layer 202b may be inadvertently exposed when forming S/D recesses, thus inhibiting the uniform growth of epitaxial S/D features in the S/D recesses.

Referring to FIGS. 1, 2A, 2B, 5A, and 5B, method 150 at operation 158 forms fin active regions 204 (hereafter referred to as the "fins 204") over the substrate 202 in a process 520. In the present embodiments, each fin 204 includes a portion of the recessed top semiconductor layer 202c' protruding from the isolation layer 202b, and a stack of alternating layers 204a and 204b (collectively referred to as the "multi-layer stack" or ML) disposed thereover, where the ML has a thickness $t_3$. Each fin 204 includes S/D regions and channel regions adjacent to the S/D regions along the fins 204. The channel regions include the ML, which interleaves with a metal gate stack formed in subsequent processes over the fins 204. The S/D regions are subsequently recessed to expose the recessed top semiconductor layer 202c' (which is also the bottom most layer of the fins 204), from where epitaxial features are formed. In the present embodiments, each layer 204a includes a semiconductor material such as, for example, Si, Ge, SiC, SiGe, GeSn, SiGeSn, SiGeCSn, and/or other suitable semiconductor materials, while each layer 204b is a sacrificial layer having a different composition from that of the layers 204a. In one such example, the layers 204a may include elemental Si but is free, or substantially free, of Ge, and the layers 204b may include SiGe. In another example, the layers 204a may include elemental Si but is free, or substantially free, of Ge, while the layers 204b may include elemental Ge but is free, or substantially free, of Si. In the present embodiments, the recessed top semiconductor layer 202c' and the layers 204a of the ML are configured to have substantially the same composition (e.g., elemental Si and free, or substantially free, of Ge). Stated differently, in some embodiments, the recessed top semiconductor layer 202c' is considered the bottommost layer of the fins 204. In some examples, the fins 204 may include a total of three to ten pairs of alternating layers 204a and 204b; of course, other configurations may also be applicable depending upon specific design requirements.

In the present embodiments, forming the ML includes alternatingly growing the layers 204a and 204b in a series of epitaxy processes, including chemical vapor deposition (CVD) techniques (for example, vapor-phase epitaxy (VPE), ultra-high vacuum CVD (UHV-CVD), low-pressure CVD (LP-CVD), and/or plasma-enhanced CVD (PE-CVD)), molecular beam epitaxy, and/or other suitable selective epitaxial growth (SEG) processes. The epitaxy process may use gaseous and/or liquid precursors containing Si and/or Ge. In some examples, the layers 204a and 204b may be formed into nanosheets, nanowires, or nanorods. A sheet (or wire) formation process may then remove the layers 204b to form multiple openings between the layers 204a. A metal gate structure is subsequently formed in the openings and over the ML, thereby providing a GAA FET. For this reason, the layers 204a are hereafter referred to as channel layers 204a, and the layers 204b are hereafter referred to as non-channel layers 204b.

The fins 204 may be fabricated using suitable processes including photolithography and etch processes. The photolithography process may include forming a photoresist layer (resist) overlying the ML, exposing the resist to a pattern, performing post-exposure bake processes, and developing the resist to form a masking element (not shown) including the resist. The masking element is then used for etching recesses 206 in the ML and the recessed top semiconductor layer 202c', thereby exposing portions of the isolation layer 202b and leaving the fins 204 protruding from the isolation layer 202b. It is noted that the recessed top semiconductor layer 202c' serves as the bottommost channel layer of the fins 204. The etching process may include dry etching, wet etching, RIE, and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204.

Now referring to FIGS. 1, 6A, and 6B, the method 150 at operation 160 forms a dielectric layer 203 over the structure 200 in a process 620. In some embodiments, the dielectric layer 203 fills the recesses 206 between the fins 204. In some embodiments, portions of the dielectric layer 203 is formed over a top surface of the fins 204. The dielectric layer 203 may include silicon oxide (SiO and/or $SiO_2$), silicon nitride (SiN), oxygen-containing silicon nitride (SiON), fluoride-doped silicate glass (FSG), a low-k dielectric material, and/or other suitable materials. In some embodiments, the dielectric layer 203 includes the same composition as that of the isolation layer 202b. In some embodiments, the dielectric layer 203 includes a multi-layer structure, for example, having one or more thermal oxide liner layers. The dielectric layer 203 may be deposited by any suitable method, such as CVD, flowable CVD (FCVD), spin-on-glass (SOG), and/or other suitable methods.

Referring to FIGS. 1, 7A, and 7B, the method 150 at operation 162 recesses the dielectric layer 203 to form isolation structures 208 in a process 720. In some embodiments, the process 720 includes applying a chemical mechanical planarization (CMP) process to remove the portions of the dielectric layer 203 formed over the fins 204, followed by recessing the dielectric layer 203 to form the isolation structures 208, thereby re-exposing the recesses 206 between the fins 204. The isolation structures 208 may include different structures, such as shallow trench isolation (STI) structures, deep trench isolation (DTI) structures, and/or local oxidation of silicon (LOCOS) structures. The recessing process may include dry etching, wet etching, RIE, and/or other suitable processes.

Figure 7C:
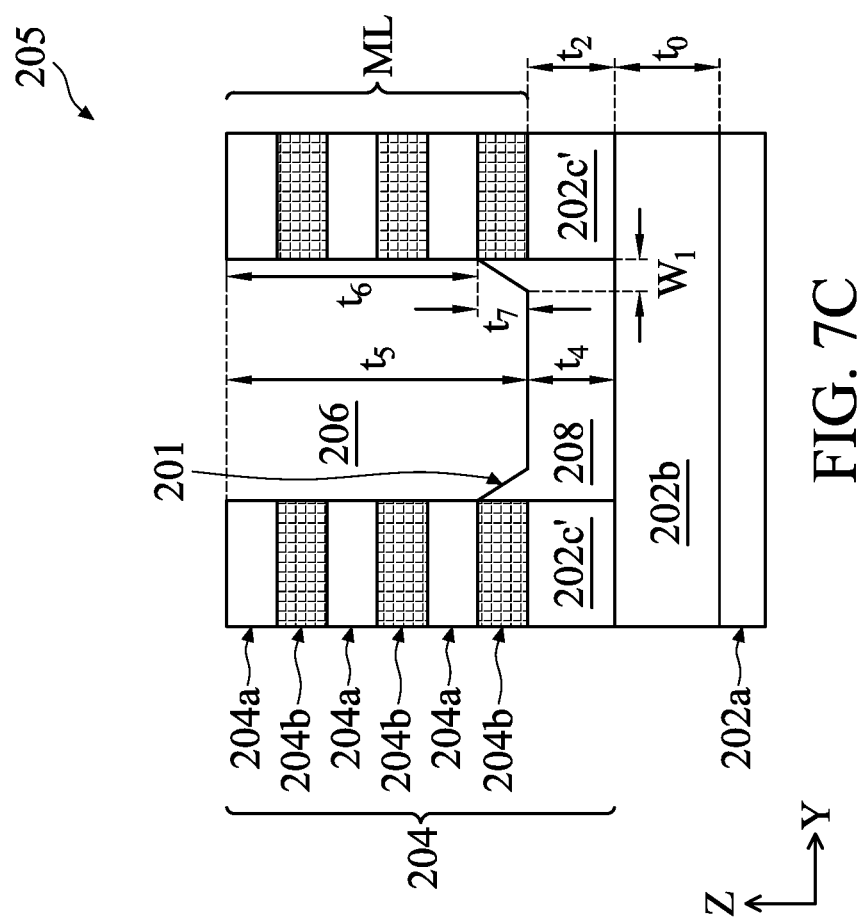

Referring to FIG. 7C, a portion 205 of the structure 200 shown in FIG. 7B is enlarged to depict various components after the recessing of the dielectric layer 203. The process 720 forms the isolation structures 208 to a thickness $t_4$ by recessing the dielectric layer 203 by a depth $t_5$. The thickness $t_4$ is configured to control the depth of subsequently-formed S/D recesses in the S/D regions of each fin 204, as will be described in detail later. In some embodiments, the thickness $t_4$ is less than the thickness $t_0$. In some examples, the thickness $t_4$ may be about 45% to about 65% (e.g., about 55%) of the thickness $t_0$. In some embodiments, the thickness $t_4$ is less than or equal to the thickness $t_2$. In some examples, the thickness $t_4$ may be about 50% to about 100% (e.g., about 75%) of the thickness $t_2$. In the present embodiments, the thickness $t_4$ is about the same as the thickness $t_2$, such that the isolation structures 208 substantially cover sidewalls of the recessed top semiconductor layer 202c' (which is also the bottommost layer of the fins 204). In other words, the depth $t_5$ of the recess 206 is substantially the same as a thickness $t_3$ of the ML. In one example, the thickness $t_4$ is about 9 nanometers to about 13 nanometers (e.g., about 11 nanometers).

If the thickness $t_4$ is too large, i.e., greater than about 65% of the thickness $t_0$ or greater than the thickness $t_2$, the metal gate structure formed in subsequent processes may not have sufficient control over the bottommost layer of the fins 204. If the thickness $t_4$ is too small, i.e., less than about 45% of the thickness $t_0$ or less than about 50% of the thickness $t_2$, forming the S/D recesses may inadvertently penetrate both the isolation structures 208 and the isolation layer 202b, thereby inadvertently exposing the bottom semiconductor layer 202a as will be discussed below.

In some embodiments, the isolation structures 208 include a curved top surface adjacent to the fins 204. In some embodiments, the curved top surface is above a top surface of the recessed top semiconductor layer 202c'. The curved top surface defines feet 201 of the isolation structures 208 adjacent to the fins 204 protruding from the isolation structures 208. The feet 201 are each defined by a width $w_1$ in a horizontal direction and a height $t_7$ in a vertical direction as depicted in FIG. 7C. The feet 201 cover sidewalls of the bottom portion of the ML, thereby leaving an exposed portion of the fins 204 (i.e., ML) having a thickness $t_6$. In some embodiments, $t_6$ is less than $t_3$ and/or $t_5$. In one example, the feet 201 may cover sidewalls of the non-channel layers 204b immediately above the recessed top semiconductor layer 202c'. In a further example, the height $t_7$ does not exceed a thickness of the non-channel layer 204b immediately above the recessed top semiconductor layer 202c'. In some embodiments, at least portions of the feet 201 remain in the structure 200. For examples, portions of the feet 201 in the S/D regions of the fins 204 (as depicted in FIGS. 7B and 7C) may remain in the structure 200 after the forming of the S/D recesses, such that fin spacers may be formed thereover. In some embodiments, portions of the feet 201 are removed from the structure 200 by subsequent processes. For example, portions of the feet 201 in the channel regions of the fins 204 may be removed along with the non-channel layers 204b of the ML before forming the metal gate structure.

Referring to FIGS. 1, 8A, and 8B, method 150 at operation 164 forms one or more dummy gate stacks (i.e., a placeholder gate) 210 that includes polysilicon over the fins 204 in a process 820. In the present embodiments, portions of the dummy gate stacks 210 are replaced with a metal gate stacks after forming other components of the structure 200. The process 820 may include a series of deposition and patterning processes. For example, the process 820 may include depositing a polysilicon layer over the fins 204 and performing an anisotropic etching process (e.g., a dry etching process) to remove portions of the polysilicon layer, resulting in the dummy gate stacks 210 disposed over the channel regions of the fins 204. In the present embodiments, the structure 200 further includes an interfacial layer 211, which is formed over the fins 204 before depositing the polysilicon layer by a suitable method, such as thermal oxidation, chemical oxidation, and/or other suitable methods. Though not depicted, one or more hard mask layers may be formed over the dummy gate stacks 210 to protect the dummy gate stacks 210 from being damaged during subsequently operations. The one or more hard mask layers are later removed before removing the dummy gate stacks 210 to form the metal gate stacks.

Thereafter, still referring FIGS. 8A and 8B, method 150 forms gate spacers 212 and fin spacers 207 over sidewalls of the dummy gate stacks 210 and sidewalls of the fins 204 (e.g., over the portions of the feet 201 as depicted herein), respectively. The spacer layer may include silicon oxide (SiO and/or $SiO_2$), silicon nitride (SiN), silicon carbide (SiC), oxygen-containing silicon nitride (SiON), carbon-containing silicon oxide (SiOC), and/or other suitable materials. The spacer layer may be a single-layer structure or a multi-layer structure including a combination of the dielectric materials provided herein. The method 150 may form the gate spacers 212 and the fin spacers 207 by first depositing a spacer layer over the structure 200 and subsequently removing portions of the spacer layer in an anisotropic etching process (e.g., a dry etching process), leaving behind portions of the spacer layer on the sidewalls of the dummy gate stacks 210 as the gate spacers 212 and on the sidewalls of the fins 204 as fin spacers 207.

Figures 9A, 9B:
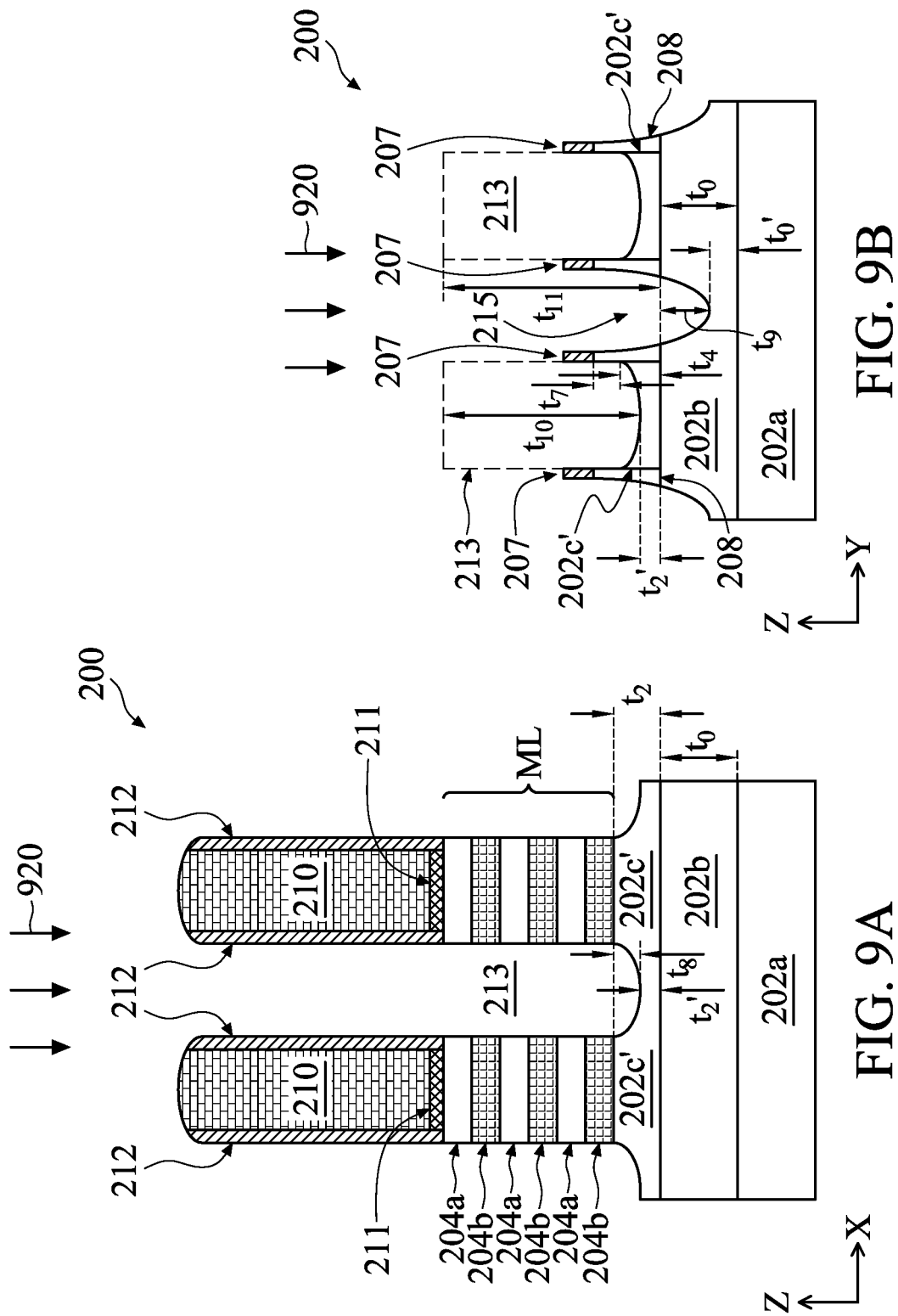

Referring to FIGS. 1, 9A, and 9B, method 150 at operation 166 forms S/D recesses 213 in S/D regions of the fins 204 to expose the recessed top semiconductor layer 202c' in a recessing process 920. In the present embodiments, the recessing process 920 is a dry etching process employing a suitable etchant capable of removing Si (i.e., the channel layers 204a) and SiGe (i.e., the non-channel layers 204b) of the ML. In some embodiments, the dry etchant is a chlorine-containing etchant including $Cl_2$, $SiCl_4$, $BCl_3$, and/or other chlorine-containing gas. In some embodiments, the recessing process 920 is tuned by adjusting duration, temperature, pressure, source power, bias voltage, bias power, etchant flow rate, and/or other suitable parameters. A cleaning process may subsequently be performed to clean the S/D recesses 213 with a hydrofluoric acid (HF) solution or other suitable solution.

As shown in FIG. 9A, the S/D recesses 213 penetrate the recessed top semiconductor layer 202c' by a depth $t_8$, such that and a remaining portion of the recessed top semiconductor layer 202c' under the S/D recesses 213 has a thickness $t_2'$. The S/D recesses 213 are formed between adjacent dummy gate stacks 210 along the X direction. The endpoint of the recessing process 920 may be gauged by either the depth $t_8$ or the thickness $t_2'$. In some embodiments, the depth $t_8$ may be about 15% to about 35% (e.g., about 25%) of the thickness $t_0$ or about 25% to about 65% (e.g., about 45%) of the thickness $t_2$. In some examples, the depth $t_8$ may be about 3 nanometers to about 7 nanometers (e.g., 5 nanometers). In some embodiments, the thickness $t_2'$ is less than the thickness $t_0$. In some embodiments, the thickness $t_2'$ is about 20% to about 40% of the thickness $t_0$ or about 35% to about 75% (e.g., about 55%) of the thickness $t_2$. In some examples, the thickness $t_2'$ may be about 4 nanometers to about 8 nanometers (e.g., 6 nanometers). If the depth $t_8$ is too small (i.e., the thickness $t_2'$ is too large), e.g., less than about 15% of the thickness $t_0$ or less than about 25% of the thickness $t_2$, the ability of the isolation layer 202b to impede current leakage between the S/D features subsequently formed in the S/D recesses 213 may be weakened. On the other hand, if the depth $t_8$ is too large (i.e., the thickness $t_2'$ is too small), e.g., over about 35% of the thickness $t_0$ or over about 65% of the thickness $t_2$, the process control may become challenging. For example, the forming of the S/D recess 213 may inadvertently expose a portion of the isolation layer 202b in the S/D recesses 213 where are not suitable for the epitaxial S/D features 216 to grow from in subsequent processes.

In the present embodiments, referring to FIG. 9B, forming the S/D recesses 213 removes portions of the isolation structures 208 adjacent to the S/D regions of the fins 204 along the Y direction, thereby forming a recess 215. In some embodiments, the recess 215 penetrates the isolation structures 208 without penetrating the isolation layer 202b, i.e., the isolation layer 202b is not exposed in the recess 215. In some embodiments, the recess 215 penetrates the isolation structure 208 to expose a top surface of the isolation layer 202b. In some embodiments, as depicted herein, the recess 215 further penetrates the isolation layer 202b by a depth $t_9$ after penetrating through the isolation structures 208, where the depth $t_9$ is less than the thickness $t_0$. In some embodiments, $t_9$ might be 0 nanometer. In other words, the recess 215 does not penetrate the isolation layer 202b. In some examples, the depth $t_9$ may be less than or equal to about 95% of the thickness $t_0$. In other words, a thickness $t_0'$ of the remaining portion of isolation layer 202b under the recess 215 may be at least about 5% of the thickness $t_0$. In some examples, the thickness $t_0'$ may be about 1 nanometer to about 20 nanometers. If the thickness $t_0'$ is too small, i.e., less than about 5% of the thickness $t_0$, the isolation layer 202b may be inadvertently penetrated through, thereby exposing a portion of the bottom semiconductor layer 202a in the recess 215. In this case, an epitaxial semiconductor feature may inadvertently grow from the exposed portion of the bottom semiconductor layer 202a in the recess 215 in addition to the desired growth from the portion of the recessed top semiconductor layer 202c' exposed in the S/D recesses 213. The inadvertently grown epitaxial semiconductor features in the recess 215 may connect adjacent epitaxial S/D features along the Y direction, thereby causing shorting issues in the structure 200.

Still referring to FIG. 9B, the dotted profile outlines each fin 204 before performing the recessing process 920 to illustrate a depth $t_{10}$ of the S/D recesses 213 in comparison to a height $t_{11}$ (i.e., fin height) of the fins 204, the thickness $t_4$, and the thickness $t_9$. In some embodiments, the height $t_{10}$ is about 85% to about 95% (e.g., about 90%) of the thickness $t_{11}$. In some embodiments, the height $t_{10}$ is greater than a sum of the thickness $t_4$ and the thickness $t_9$. In some examples, the sum of the thickness $t_4$ and the thickness $t_9$ may be less than about 65% of the thickness $t_{10}$. In some examples, $t_{10}$ may be about 52 nanometers to about 56 nanometers (e.g., about 54 nanometers), while $t_{11}$ may be about 60 nanometers, $t_4$ may be about 6 nanometers, and $t_9$ may be about 29 nanometers.

As explained above regarding FIGS. 9A and 9B, the recessing process 920 removes the S/D regions of the fins 204 to form the S/D recesses 213, while removes the isolation structures 208 and the isolation layers 202b to form recess 215. However, the ML, the isolation structures 208, and the isolation layer 202b are configured with different materials and thus have different etching rates during the recessing process 920. When a desired value of the thickness $t_2'$ is reached, the recess 215 may be too deep such that the bottom semiconductor layer 202a is inadvertently exposed. To compensate for the differences in the etching rate such that the depth of the recess 215 can be controlled in a reasonable range (i.e., the thicknesses $t_0'$ and $t_9$ are within the ranges as discussed above), the isolation structures 208 are configured to the thickness $t_4$ that is about 45% to about 65% of the thickness $t_0$ as discussed above. If the thickness $t_4$ of the isolation structures 208 is too small, e.g., less than about 45% of the thickness $t_0$, the recessing process 920 may etch through the isolation layer 202b and thus expose a portion of the bottom semiconductor layer 202a in the recess 215. The exposed portion of the bottom semiconductor layer 202a may serve as a growth surface for unintentional epitaxial growth between adjacent fins 204 when forming S/D features in the S/D recesses 213. On the other hand, if $t_4$ is too large, e.g., greater than about 65% of the thickness $t_0$, the metal gate structure formed in subsequent processes may not cover the sidewalls of the recessed top semiconductor layer 202c' (which is also the bottommost layer of the fins 204) sufficiently, thus weakening the gate control of the metal gate structure.

Referring to FIGS. 10A and 10B, method 150 forms inner spacers 214 on portions of the non-channel layers 204b exposed in the S/D recesses 213. The inner spacers 214 may include any suitable dielectric material comprising silicon, carbon, oxygen, nitrogen, and/or other suitable elements. For example, the inner spacers 214 may include silicon nitride (SiN), silicon oxide (SiO and/or $SiO_2$), carbon-containing silicon nitride (SiCN), carbon-containing silicon oxide (SiOC), oxygen-containing silicon nitride (SiON), silicon (Si), carbon-and-oxygen-doped silicon nitride (SiOCN), a low-k dielectric material, tetraethylorthosilicate (TEOS), doped silicon oxide (e.g., borophosphosilicate glass (BPSG), fluoride-doped silicate glass (FSG), phospho-silicate glass (PSG), boron-doped silicate glass (BSG), etc.), air, and/or other suitable dielectric material. The inner spacers 214 may each be configured as a single-layer structure or a multi-layer structure including a combination of the dielectric materials provided herein. In some embodiments, the inner spacers 214 have a different composition from that of the gate spacers 212.

Method 150 may form the inner spacers 214 in a series of etching and deposition processes. For example, forming the inner spacers 214 may begin with selectively removing portions of the non-channel layers 204b (without removing or substantially removing portions of the channel layers 204a and the recessed top semiconductor layer 202c') to form trenches (not depicted). The non-channel layers 204b may be removed by any suitable process, such as a dry etching process. Subsequently, one or more dielectric layers are formed in the trenches, followed by one or more etching processes to remove (i.e., etch back) excess dielectric layer(s) deposited on exposed surfaces of the channel layers 204a and the recessed top semiconductor layer 202c', thereby forming the inner spacers 214 as depicted in FIG. 10A. The one or more dielectric layers may be deposited by any suitable method, such as atomic layer deposition (ALD), CVD, physical vapor deposition (PVD), and/or other suitable methods.

Still referring to FIGS. 10A and 10B, method 150 at operation 168 forms an epitaxial S/D feature 216 in each S/D recess 213 in a process 1020. Each of the epitaxial S/D features 216 may be suitable for forming a p-type FET device (e.g., including a p-type epitaxial material) or alternatively, an n-type FET device (e.g., including an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. In some embodiments, one or more epitaxy growth processes are performed to grow an epitaxial material in each S/D recess 213. For example, method 150 may implement the epitaxy growth process as discussed above with respect to forming the layers 204a and 204b of the ML. In some embodiments, the epitaxial material is doped in-situ by adding a dopant to a source material during the epitaxy process. In some embodiments, the epitaxial material is doped by an ion implantation process after performing the epitaxy process. In some embodiments, an annealing process is subsequently performed to activate the dopants in the epitaxial S/D features 216.

Figures 11A, 11B:
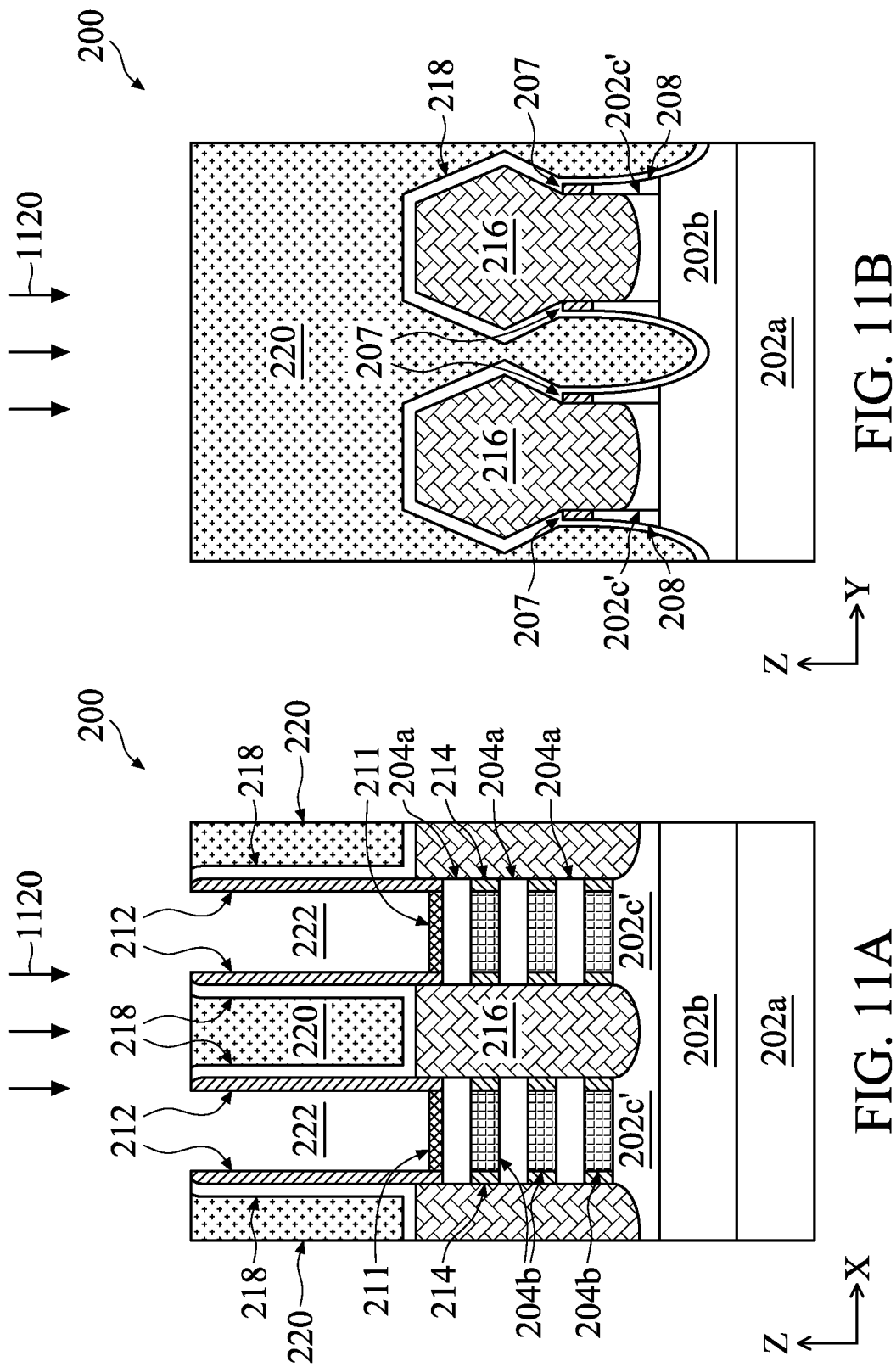

Referring to FIGS. 11A and 11B, after forming the epitaxial S/D features 216, method 150 forms an interlayer dielectric (ILD) layer 220 over the structure 200 by CVD, FCVD, SOG, and/or other suitable methods. The ILD layer 220 may include silicon oxide, a low-k dielectric material, TEOS, doped silicon oxide (e.g., BPSG, FSG, PSG, BSG, etc.), and/or other suitable dielectric materials. In the depicted embodiments, method 150 first forms an etch-stop layer (ESL) 218 over the epitaxial S/D features 216 and the dummy gate stacks 210 before forming the ILD layer 220. The ESL 218 may include silicon nitride (SiN), oxygen-containing silicon nitride (SiON), oxygen-doped silicon nitride (SiON), carbon-doped silicon nitride (SiCN), and/or other suitable materials, and may be formed by CVD, PVD, ALD, and/or other suitable methods. Thereafter, method 150 may planarize the ILD layer 220 and the ESL 218 in one or more CMP processes to expose a top surface of the dummy gate stacks 210.

Thereafter, method 150 at operation 170 replaces the dummy gate stacks 210 and the non-channel layers 204b with a metal gate structure 230 as shown in FIGS. 11A to 13B. Firstly, as shown in FIGS. 11A and 11B, at least portions of the dummy gate stacks 210 are removed from the structure 200 to form the gate trenches 222 in an etching process 1120. The etching process 1120 may include a dry etching process. In some embodiments, the interfacial layer 211 remains over the ML after removing the dummy gate stacks 210.

Referring to FIGS. 12A and 12B, method 150 removes the non-channel layers 204b from the ML in an etching process 1220, thereby forming openings 224 between the channel layers 204a and the recessed top semiconductor layer 202c'. The non-channel layers 204b may be selectively removed by any suitable etching process, such as dry etching, wet etching, RIE, or combinations thereof, without removing, or substantially removing the channel layers 204a. In one example, a wet etching process employing ammonia ($NH_3$) and/or hydrogen peroxide ($H_2O_2$) may be performed to selectively remove the non-channel layers 204b. In another example, a dry etching process employing HF and/or other fluorine-based etchant(s), such as $CF_4$, $SF_6$, $CH_2F_2$, $CHF_3$, $C_2F_6$, and/or other fluorine-containing etchants, may be implemented to remove the non-channel layers 204b. Portions of the feet 201 in the channel regions of the fins 204 under the dummy gate may be removed or substantially removed in the etching process 1220, such that the gate control over the channel regions of the fins 204 may not be compromised. A cleaning process may be subsequently performed to remove any etching residue from the openings 224.

Referring to FIGS. 13A and 13B, method 150 subsequently forms the metal gate structure 230 over the interfacial layer 211 in the gate trenches 222 and in the openings 224 in a process 1320, such that the metal gate structure 230 is interposed between the epitaxial S/D features 216. The metal gate structure 230 includes at least a high-k dielectric layer (not depicted) disposed in the gate trenches 222 and in the openings 224 and a metal gate electrode (not depicted) disposed over the high-k dielectric layer. The high-k dielectric layer may include any suitable high-k dielectric material, such as hafnium oxide, lanthanum oxide, and/or other suitable materials. The metal gate electrode may include at least one work function metal layer and a bulk conductive layer disposed over the work function metal layer. The work function metal layer includes a p-type and/or an n-type work function metal layer. Example work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, and/or other suitable work function materials. The bulk conductive layer may include Cu, W, Al, Co, Ru, and/or other suitable materials. The metal gate structure 230 may further include numerous other layers (not depicted), such as a capping layer, a barrier layer, and/or other suitable layers. Various layers of the metal gate structure 230 may be deposited by any suitable method, such as ALD, CVD, PVD, plating, and/or other suitable methods.

Thereafter, referring to FIGS. 14A and 14B, method 150 at operation 172 performs additional processing steps to the structure 200. For example, method 150 may form S/D contacts 242 over the epitaxial S/D features 216. Each S/D contact 242 may include any suitable conductive material, such as Co, W, Ru, Cu, Al, Ti, Ni, Au, Pt, Pd, and/or other suitable conductive materials. Method 150 may form an S/D contact hole (or trench) in the ILD layer 220 via a series of patterning and etching processes and subsequently deposit a conductive material in the S/D contact hole using any suitable method, such as CVD, ALD, PVD, plating, and/or other suitable processes. In some embodiments, a silicide layer (not depicted) is formed between the epitaxial S/D features 216 and the S/D contact 242. The silicide layer may include nickel silicide, cobalt silicide, tungsten silicide, tantalum silicide, titanium silicide, platinum silicide, erbium silicide, palladium silicide, and/or other suitable silicide. The silicide layer may be formed over the epitaxial S/D feature 216 by a series of deposition, thermal, and etching processes. Subsequently, method 150 may form additional features over the structure 200 including, for example, an ESL 250 disposed over the ILD layer 220, an ILD layer 252 disposed over the ESL 250, a gate contact 254 in the ILD layer 252 to contact the metal gate structure 230, vertical interconnect features (e.g., vias; not depicted), horizontal interconnect features (e.g., conductive lines; not depicted), additional intermetal dielectric layers (e.g., ESLs and ILD layers; not depicted), and/or other suitable features.

Although not intended to be limiting, one or more embodiments of the present disclosure provide many benefits to a semiconductor device and the formation thereof. For example, the present disclosure provides a semiconductor structure that includes a substrate having a top semiconductor layer over an isolation layer, where the top semiconductor layer is recessed to a desired thickness to reduce current leakage. In the present embodiments, the recessed top semiconductor layer has a thickness less than that of the isolation layer. Furthermore, in the present embodiments, isolation features (e.g., STI) are configured as an etching buffer, such that the forming of the S/D recess does not penetrate the bottom semiconductor layer of the substrate inadvertently. Embodiments of the disclosed methods can be readily integrated into existing processes and technologies for manufacturing GAA FETs.

In one aspect, the present disclosure provides a method that includes providing a substrate including a first semiconductor layer over a dielectric layer, thinning the first semiconductor layer to a thickness less than a thickness of the dielectric layer, forming a stack of alternating second semiconductor layers and third semiconductor layers over the thinned first semiconductor layer, and forming a fin active region protruding from the substrate, where the fin active region includes a portion of the thinned first semiconductor layer and the stack of alternating second semiconductor layers and third semiconductor layers disposed thereon, and where the forming of the fin active region exposes a portion of the dielectric layer. The method then proceeds to forming isolation features over the exposed portion of the dielectric layer, where the isolation features cover sidewalls of the thinned first semiconductor layer, forming a dummy gate stack over the fin active region, forming a source/drain (S/D) recess in the fin active region adjacent to the dummy gate stack, where forming the S/D recess removes a portion of the thinned first semiconductor layer, and forming an epitaxial S/D feature in the S/D recess. Thereafter, the method removes the second semiconductor layers to form openings between the third semiconductor layers, where the openings are formed adjacent to the epitaxial S/D feature and forms a metal gate stack in the openings and in place of the dummy gate stack.

In another aspect, the present disclosure provides a method that includes providing a semiconductor layer over an oxide layer, oxidizing a portion of the semiconductor layer, etching the oxidized portion of the semiconductor layer, such that the etched semiconductor layer is defined by a thickness less than a thickness of the oxide layer, forming a multi-layer structure (ML) including alternating channel layers and non-channel layers over the etched semiconductor layer, patterning the ML and the etched semiconductor layer to form a fin active region, thereby exposing a portion of the oxide layer, and forming an isolation structure surrounding a bottom portion of the fin active region, where the forming includes: depositing an isolation material over the exposed portion of the oxide layer, and recessing the isolation material to form the isolation structure having a thickness less than that of the oxide layer. The method then proceeds to forming a placeholder gate stack over the fin active region, forming a source/drain (S/D) recess in the fin active region and adjacent to the placeholder gate stack to penetrate the etched semiconductor layer, where a depth of the penetration in the etched semiconductor layer is less than a thickness of the oxide layer, and forming an S/D feature in the S/D recess. Thereafter, the method forms a metal gate stack in place of the placeholder gate stack and the non-channel layers of the ML.

In yet another aspect, the present disclosure provides a semiconductor structure including a substrate having a dielectric layer over a semiconductor layer, a fin protruding from the dielectric layer, where the fin includes a stack of channel layers, and a metal gate structure disposed over the fin and interleaved with the stack of channel layers. In the present embodiments, the semiconductor structure includes an isolation structure over the dielectric layer covering sidewalls of a bottommost channel layer, and an epitaxial source/drain (S/D) feature disposed adjacent to the metal gate structure, where a bottom surface of the epitaxial S/D feature is defined by the bottommost channel layer, and where a portion of the bottommost channel layer under the epitaxial S/D feature has a thickness less than a thickness of the dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate including a first semiconductor layer over a dielectric layer;
   thinning the first semiconductor layer to a thickness less than a thickness of the dielectric layer;
   forming a stack of alternating second semiconductor layers and third semiconductor layers over the thinned first semiconductor layer;
   forming a fin active region protruding from the substrate, wherein the fin active region includes a portion of the thinned first semiconductor layer and the stack of alternating second semiconductor layers and third semiconductor layers disposed thereon, and wherein the forming of the fin active region exposes a portion of the dielectric layer;
   forming isolation features over the exposed portion of the dielectric layer, wherein the isolation features cover sidewalls of the thinned first semiconductor layer;
   forming a dummy gate stack over the fin active region;
   forming a source/drain (S/D) recess in the fin active region adjacent to the dummy gate stack, wherein forming the S/D recess removes a portion of the thinned first semiconductor layer;
   forming an epitaxial S/D feature in the S/D recess;
   removing the second semiconductor layers to form openings between the third semiconductor layers, wherein the openings are formed adjacent to the epitaxial S/D feature; and
   forming a metal gate stack in the openings and in place of the dummy gate stack.

2. The method of claim 1, wherein the thinning of the first semiconductor layer includes:
   oxidizing a portion of the first semiconductor layer; and
   etching the oxidized portion of the first semiconductor layer to form the thinned first semiconductor layer.

3. The method of claim 2, wherein the oxidizing of the portion of the first semiconductor layer includes oxidizing about 25% to about 65% of a thickness of the first semiconductor layer, and wherein the thinned first semiconductor layer has a thickness of about 45% to about 65% of a thickness of the dielectric layer.

4. The method of claim 1, wherein the forming of the isolation features includes:
   depositing a dielectric material over the fin active region and the exposed portion of the dielectric layer of the substrate, thereby surrounding the fin active region with the dielectric material;
   planarizing the dielectric material to remove portions of the dielectric material deposited over the fin active region; and
   recessing remaining portions of the dielectric material to form the isolation features.

5. The method of claim 4, wherein isolation features are formed to a thickness of about 45% to about 65% of the dielectric layer.

6. The method of claim 1, wherein the forming of the S/D recess removes a portion of the isolation features, thereby exposing the dielectric layer of the substrate.

7. The method of claim 6, wherein the forming of the S/D recess further removes a portion of the dielectric layer.

8. A method, comprising:
   providing a semiconductor layer over an oxide layer;
   oxidizing a portion of the semiconductor layer;
   etching the oxidized portion of the semiconductor layer, such that the etched semiconductor layer is defined by a thickness less than a thickness of the oxide layer;
   forming a multi-layer structure (ML) including alternating channel layers and non-channel layers over the etched semiconductor layer;
   patterning the ML and the etched semiconductor layer to form a fin active region, thereby exposing a portion of the oxide layer;
   forming an isolation structure surrounding a bottom portion of the fin active region, wherein the forming includes:
     depositing an isolation material over the exposed portion of the oxide layer; and
     recessing the isolation material to form the isolation structure having a thickness less than that of the oxide layer;
   forming a placeholder gate stack over the fin active region;

forming a source/drain (S/D) recess in the fin active region and adjacent to the placeholder gate stack to penetrate the etched semiconductor layer, wherein a depth of the penetration in the etched semiconductor layer is less than a thickness of the oxide layer;

forming an S/D feature in the S/D recess; and forming a metal gate stack in place of the placeholder gate stack and the non-channel layers of the ML.

9. The method of claim 8, wherein the thickness of the etched semiconductor layer is about 45% to about 65% of the thickness of the oxide layer.

10. The method of claim 8, wherein the isolation structure is formed to a thickness about the same as that of the etched semiconductor layer.

11. The method of claim 10, wherein a thickness of the isolation structure is about 45% to about 65% of the thickness of the oxide layer.

12. The method of claim 8, wherein the forming of the S/D recess forms a recess in the isolation structure adjacent to the fin active region.

13. The method of claim 12, wherein the S/D recess further penetrates the oxide layer.

14. The method of claim 8, wherein a distance between a lowest point of the S/D recess to a top surface of the oxide layer is about 20% to about 40% of a thickness of the oxide layer.

15. A method, comprising:
providing a structure including a semiconductor substrate over a dielectric layer;
thinning the semiconductor substrate;
forming a stack of alternating channel layers and sacrificial layers over the thinned semiconductor substrate;
patterning the stack and the thinned semiconductor substrate to form a fin;
forming an isolation structure over the dielectric layer and along a sidewall of the thinned semiconductor substrate;
forming a dummy gate stack over a channel region of the fin;
performing a recessing process to the structure, thereby forming a source/drain recess in a source/drain region of the fin and a recess in the isolation structure adjacent to the source/drain region, wherein the thinned semiconductor substrate is exposed in the source/drain recess and the dielectric layer is exposed in the recess;
forming a source/drain feature in the source/drain recess; and
replacing the dummy gate stack and the sacrificial layers with a metal gate stack.

16. The method of claim 15, wherein performing the recessing process removes a portion of the dielectric layer in the recess.

17. The method of claim 15, wherein thinning the semiconductor substrate includes:
oxidizing a top layer of the semiconductor substrate, and
removing the oxidized top layer of the semiconductor substrate.

18. The method of claim 15, wherein performing the recessing process removes the stack and a portion of the thinned semiconductor substrate in the source/drain region of the fin.

19. The method of claim 15, wherein the method further comprises forming a gate spacer layer along a sidewall of the dummy gate stack and on a first portion of the isolation structure adjacent to the fin,
wherein performing the recessing process removes a second portion of the isolation structure not covered by the gate spacer layer, and
wherein after performing the recessing process, the first portion of the isolation structure remains.

20. The method of claim 15, further comprising forming an etch stop layer (ESL) on the exposed dielectric layer and over the source/drain feature,
wherein the thinned semiconductor substrate in the source/drain region is spaced apart from the ESL by the isolation structure.

* * * * *